(12) United States Patent
Fu et al.

(10) Patent No.: US 10,833,429 B2
(45) Date of Patent: Nov. 10, 2020

(54) CONDUCTIVE TERMINAL AND CONNECTOR ASSEMBLY

(71) Applicant: Tyco Electronics (Shanghai) Co. Ltd., Shanghai (CN)

(72) Inventors: Xiaozhi Fu, Shanghai (CN); Ming Shi, Shanghai (CN); Hongtao Jiang, Shanghai (CN); Wei Zhang, Shanghai (CN); Dingbing Fan, Shanghai (CN); Shuzhi Wang, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/665,600

(22) Filed: Oct. 28, 2019

(65) Prior Publication Data
US 2020/0136274 A1    Apr. 30, 2020

(30) Foreign Application Priority Data

Oct. 26, 2018    (CN) .......................... 2018 1 1258797

(51) Int. Cl.
H01R 4/28 (2006.01)
H01R 12/51 (2011.01)
H01R 12/57 (2011.01)
H01R 12/58 (2011.01)
H01R 12/70 (2011.01)
H05K 1/18 (2006.01)

(52) U.S. Cl.
CPC ............. *H01R 4/28* (2013.01); *H01R 12/515* (2013.01); *H01R 12/57* (2013.01); *H01R 12/58* (2013.01); *H01R 12/7005* (2013.01); *H05K 1/18* (2013.01); *H05K 2201/09072* (2013.01)

(58) Field of Classification Search
CPC . H01R 4/28; H01R 12/51; H01R 4/48; H01R 12/515; H01R 12/57; H01R 12/58; H01R 12/7005; H05K 1/18; H05K 2201/09072
See application file for complete search history.

(56) References Cited

U.S. PATENT DOCUMENTS

| 7,513,793 | B2 * | 4/2009 | Horst | H01R 4/4818 439/427 |
| 8,328,586 | B2 * | 12/2012 | Bies | H01R 4/4845 439/725 |
| D755,721 | S * | 5/2016 | Bies | D13/137.1 |
| 9,735,479 | B2 * | 8/2017 | Chen | H01R 4/48 |

(Continued)

*Primary Examiner* — Abdullah A Riyami
*Assistant Examiner* — Nader J Alhawamdeh
(74) *Attorney, Agent, or Firm* — Barley Snyder

(57) ABSTRACT

A conductive terminal includes a support frame defining a receiving space, a pair of first clamping arms arranged in the receiving space, and a pair of second clamping arms arranged in the receiving space. A pair of first clamping portions are disposed at a pair of ends of the first clamping arms. The first clamping portions are adapted to clamp a conductor of a wire inserted in a first insertion direction and electrically connect the wire with the conductive terminal. A pair of second clamping portions are disposed at a pair of ends of the second clamping arms. The second clamping portions are adapted to clamp the conductor of the wire inserted in a second insertion direction different from the first insertion direction and electrically connect the wire with the conductive terminal.

19 Claims, 9 Drawing Sheets

(56) References Cited

U.S. PATENT DOCUMENTS

| | | | | |
|---|---|---|---|---|
| 9,780,488 B2* | 10/2017 | Fu | ............... | H01R 12/515 |
| 9,799,968 B2* | 10/2017 | Lin | ............... | H01R 4/70 |
| 9,831,581 B2* | 11/2017 | Fu | ............... | H01R 4/4827 |
| 10,177,477 B2* | 1/2019 | Fu | ............... | H01R 12/707 |
| 10,389,049 B2* | 8/2019 | Stromiedel | ............... | H01R 12/515 |
| 2017/0077622 A1* | 3/2017 | Fu | ............... | H01R 4/4827 |
| 2019/0229445 A1* | 7/2019 | Fu | ............... | H05K 3/325 |

* cited by examiner

CONDUCTIVE TERMINAL AND CONNECTOR ASSEMBLY

CROSS-REFERENCE TO RELATED APPLICATION

This application claims the benefit of the filing date under 35 U.S.C. § 119(a)-(d) of Chinese Patent Application No. 201811258797.X, filed on Oct. 26, 2018.

FIELD OF THE INVENTION

The present invention relates to a conductive terminal and, more particularly, to a conductive terminal connecting a wire to a circuit board.

BACKGROUND

A wire is generally electrically connected to an electrical board by an electrical connector. A conductive terminal of the electrical connector is fixed in an insulating housing in advance, and then electrically connected to and fixed to the electrical board. However, such a connecting means is not only costly, but also causes the insulating housing to occupy a larger space of the electrical board.

In order to overcome the deficiency, some conductive terminals electrically connect the wire to the electrical board without the housing. Nevertheless, an insertion direction of the wire is unchanged for the conductive terminal; the conductive terminal only allows the wire to be inserted horizontally or vertically. It is desirable for a conductive terminal to allow the wire to be inserted therein both horizontally and vertically. Further, a current conductive terminal without a housing has low locating and holding performance for the wire inserted therein, and thus the wire is easily disconnected therefrom.

SUMMARY

A conductive terminal includes a support frame defining a receiving space, a pair of first clamping arms arranged in the receiving space, and a pair of second clamping arms arranged in the receiving space. A pair of first clamping portions are disposed at a pair of ends of the first clamping arms. The first clamping portions are adapted to clamp a conductor of a wire inserted in a first insertion direction and electrically connect the wire with the conductive terminal. A pair of second clamping portions are disposed at a pair of ends of the second clamping arms. The second clamping portions are adapted to clamp the conductor of the wire inserted in a second insertion direction different from the first insertion direction and electrically connect the wire with the conductive terminal.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
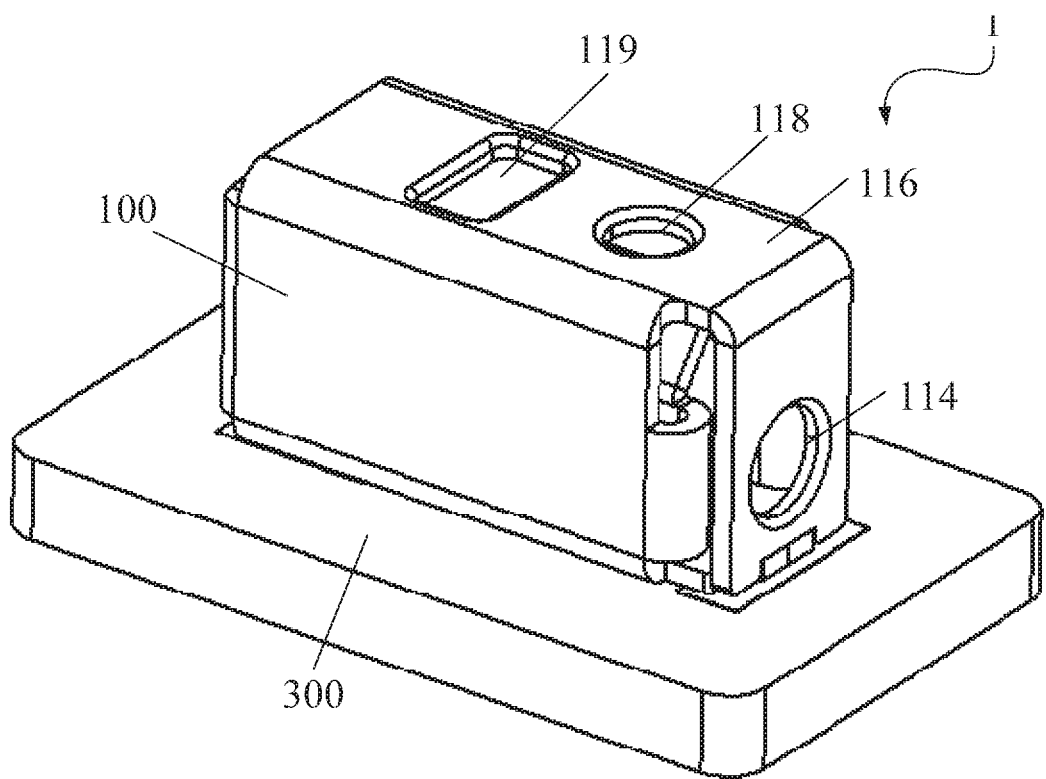
FIG. 1 is a perspective view of a connector assembly according to an embodiment.

The technical solution of the present disclosure will be described hereinafter in further detail with reference to the following embodiments, taken in conjunction with the accompanying drawings. In the specification, the same or similar reference numerals indicate the same or similar parts. The description of the embodiments of the present disclosure hereinafter with reference to the accompanying drawings is intended to explain the general inventive concept of the present disclosure, and should not be constructed as a limitation to the present disclosure.

In addition, in the following detailed description, for the sake of explanation, numerous specific details are set forth in order to provide a thorough understanding of the disclosed embodiments. It will be apparent, however, one or more embodiments may also be practiced without these specific details. In other instances, well-known structures and devices are illustrated schematically in order to simplify the drawing.

A conductive terminal 100 according to an embodiment, as shown in FIGS. 1-5, is adapted to electrically connect a wire 200 to a circuit board 300, as shown in FIGS. 6-9.

The conductive terminal 100, as shown in FIGS. 1-5, includes a support frame 110, a pair of first clamping arms 120, and a pair of second clamping arms 130. The support frame 110 defines a receiving space therein and in which the pair of first clamping arms 120 and the pair of second clamping arms 130 are arranged. A pair of first clamping portions 121 are formed at ends of the pair of first clamping arms 120 and adapted to clamp a conductor 210 of the wire 200 inserted in a first insertion direction, so that the wire 200 is electrically connected with the conductive terminal 100. A pair of second clamping portions 131 are formed at ends of the pair of second clamping arms 130 and adapted to clamp the conductor 210 of the wire 200 inserted in a second insertion direction different from the first insertion direction, so that the wire 200 is electrically connected with the conductive terminal 100.

Figure 2:
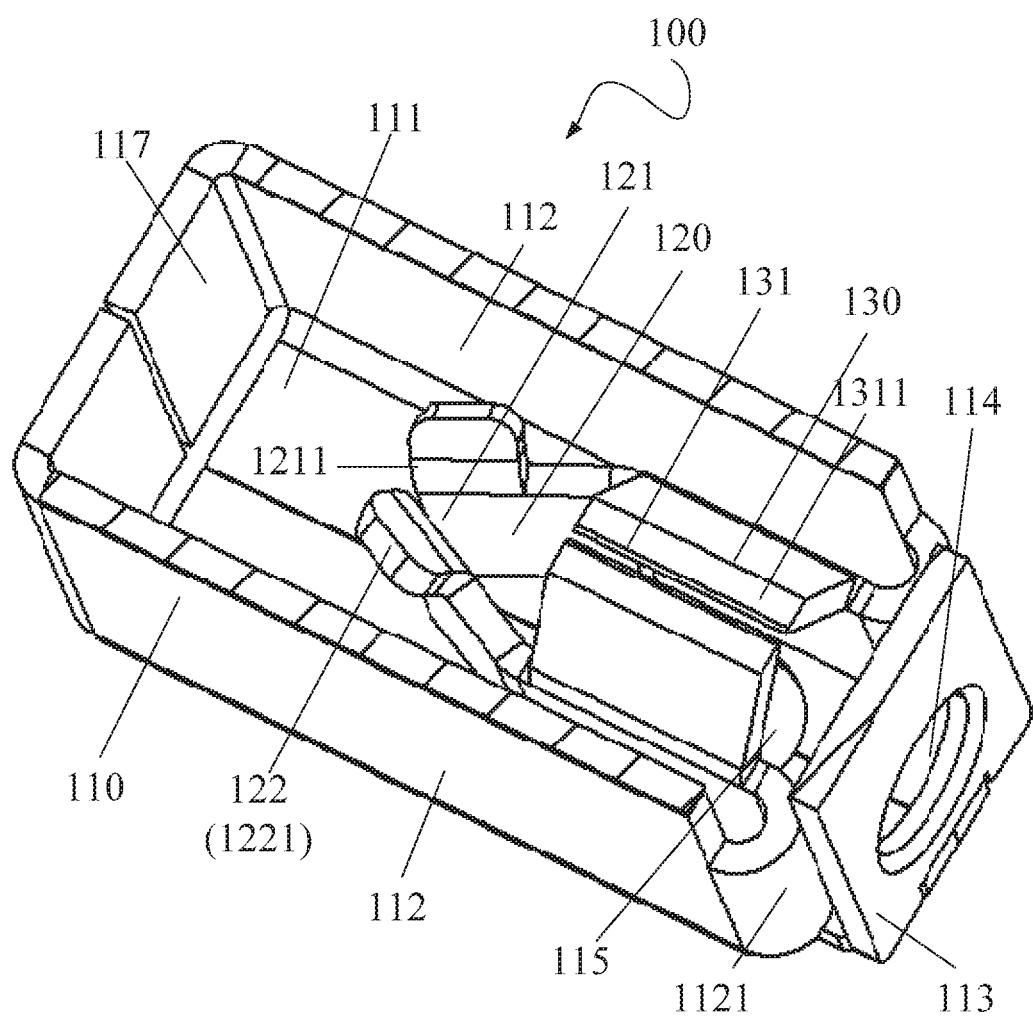
FIG. 2 is a sectional perspective view of a conductive terminal of the connector assembly.
Figure 3:
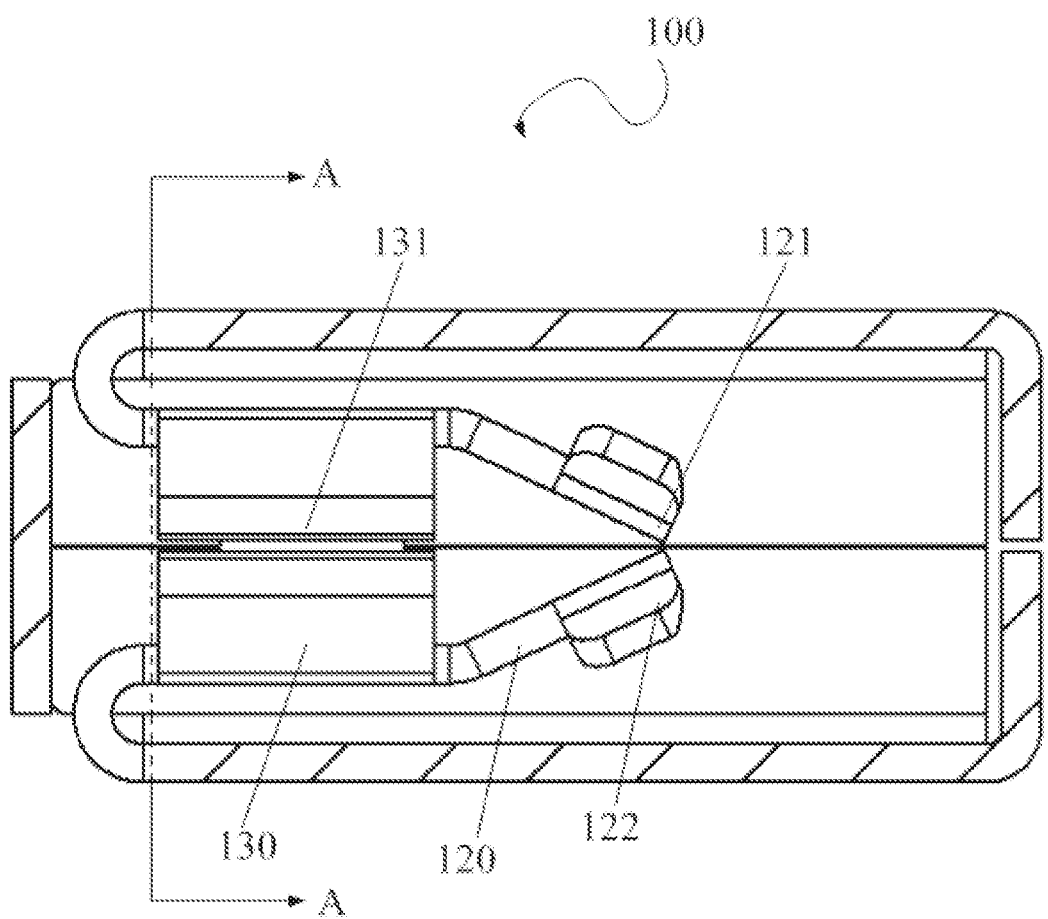
FIG. 3 is sectional top view of the conductive terminal.
Figure 4:
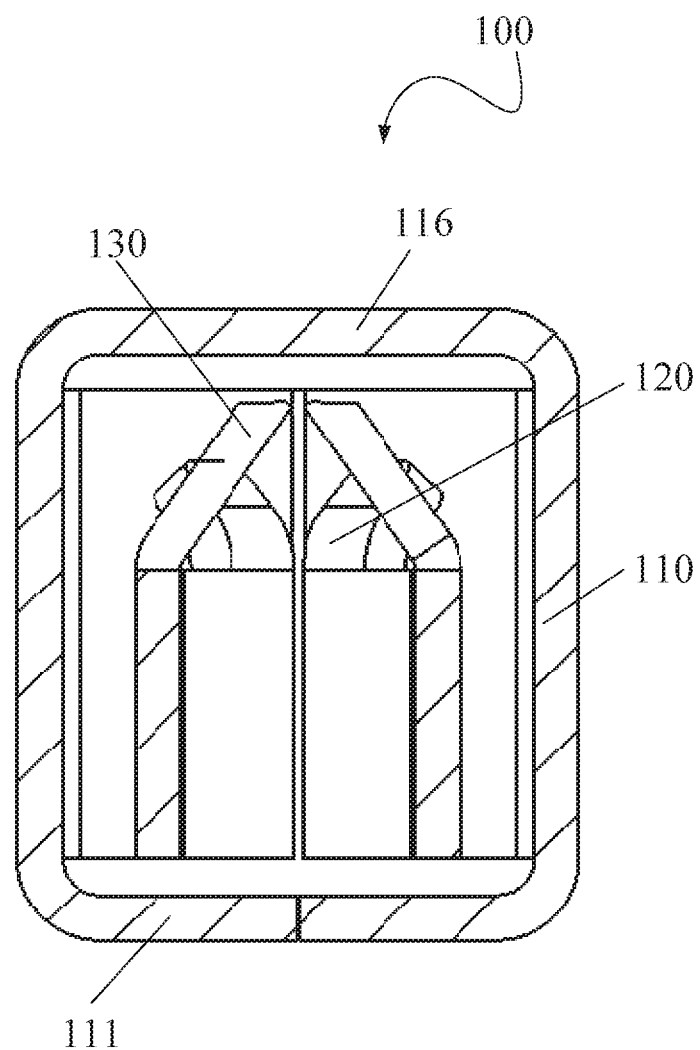
FIG. 4 is a sectional end view of the conductive terminal, taken along plane A-A of FIG. 3.
Figure 5:
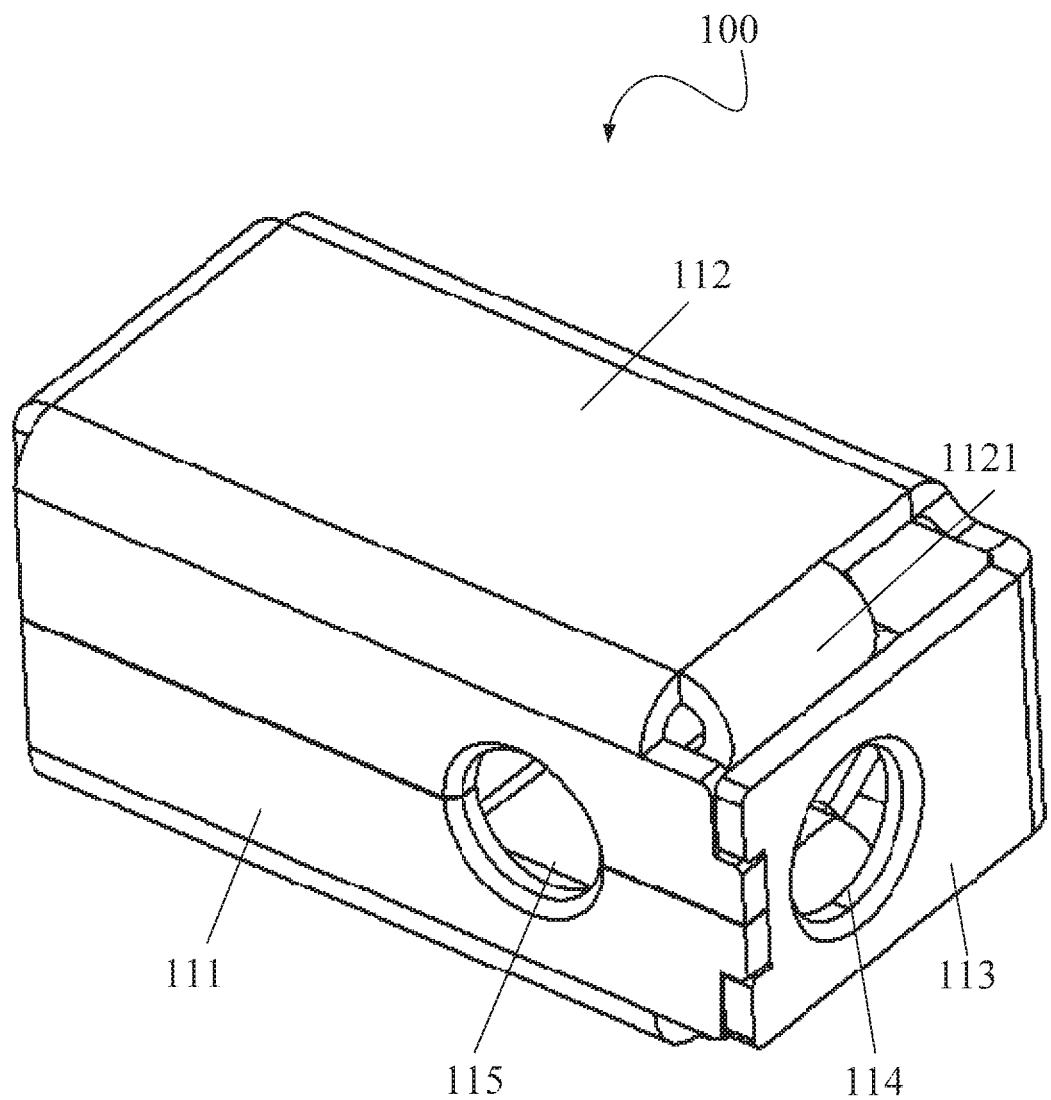
FIG. 5 is a perspective view of the conductive terminal.

The support frame 110, as shown in FIGS. 2 and 5, includes a bottom wall 111, a pair of side walls 112, a first end wall 113 at a first end of the support frame 110, a second end wall 117 at a second end of the support frame 110 and opposite to the first end wall 113, and a top wall 116. In an embodiment, the side walls 112 are perpendicular to the bottom wall 111. In the shown embodiment, the side walls 112 are formed by bending perpendicularly downward from both sides of the top wall 116. The bottom wall 111 is formed by bending perpendicularly from a lower side of at least one of the two side walls 112 toward the other opposite to the side wall 112 where the lower side is located. The first end wall 113 is formed by perpendicularly bending from one end of the top wall 116 toward the bottom wall. In an embodiment, the second end wall 117 is formed by bending perpendicularly from the other end of the top wall 116 toward the bottom wall. In another embodiment, the second end wall 117 is formed by bending from one end of the two side walls 112 towards each other in a direction perpendicular to a plane where the side walls 112 are located.

In an embodiment, the support frame 110, the first clamping arm 120, and the second clamping arm 130 are integrally formed from a single piece of sheet metal. The conductive terminal 100 is formed from a single metal sheet such as a copper sheet by a shearing, stamping, and bending processes.

As shown in FIGS. 6-9, the first insertion direction is perpendicular to the second insertion direction. The first insertion direction is parallel to the plane where the bottom wall 111 is located, and the second insertion direction is perpendicular to the plane where the bottom wall 111 is located. In an embodiment, the first insertion direction is a horizontal direction and the second insertion direction is a vertical direction. In another embodiment, the first insertion direction and the second insertion direction may be non-perpendicular, for example, the first insertion direction is a direction intersecting the plane where the bottom wall 111 is located at an angle other than 90 degrees.

The support frame 110, as shown in FIG. 2, includes a pair of cantilevers 1121 that are formed by bending inwardly from the first ends of the two side walls 112. In an embodiment, the pair of first clamping arms 120 extend downstream in the first insertion direction and obliquely toward each other respectively from free ends of the cantilevers 1121 away from the first ends of the side walls 112.

In an embodiment, the pair of second clamping arms 130 extend downstream in the second insertion direction and obliquely toward each other respectively from sides of the cantilevers 1121 away from the bottom wall 111. In the embodiment shown in FIG. 2, the pair of first clamping arms 120 extend obliquely toward each other respectively from the free ends of the cantilevers 1121 away from the first end of the side wall 112 toward second ends of the side walls 112 opposite to the first end. The pair of second clamping arms 130 extend obliquely upwardly toward each other respectively from sides of the cantilevers 1121 away from the bottom wall 111.

In another embodiment, the support frame 110 includes two pairs of cantilevers 1121 that are respectively formed by bending inwardly from the first ends of the two side walls 112. In this case, the pair of first clamping arms 120 extend downstream in the first insertion direction and obliquely toward each other respectively from the free ends of one of one pair of the cantilevers 1121 away from the first end of the side wall 112, and the pair of second clamping arms 130 extend downstream in the second insertion direction obliquely toward each other respectively from the sides of one of the other pair of the cantilevers 1121 away from the bottom wall 111.

As shown in FIGS. 1-5, the first end wall 113 is located at the first end of the support frame 110 and has a first insertion hole 114 adapted to allow the conductor 210 of the wire 200 to be inserted therethrough in the first insertion direction. The bottom wall 111 has a second insertion hole 115 adapted to allow the conductor 210 of the wire 200 to be inserted therethrough in the second insertion direction. In the shown embodiment, the second insertion hole 115 is aligned with the second clamping arm 130. In another embodiment, the second insertion hole 115 may be not aligned with the second clamping arm 130.

As shown in FIGS. 1-5, the top wall 116 has a through hole 118 to allow the conductor 210 of the wire 200 inserted in the second insertion direction to extend out of the conductive terminal 100. In the shown embodiment, the second insertion hole 115 is aligned with the second clamping arm 130 and the through hole 118. In another embodiment, the second insertion hole 115 may be not aligned with the second clamping arm 130 and the through hole 118. In an embodiment, the top wall 116 may not be provided with the through hole 118; in this case, the conductor 210 of the wire 200 inserted in the second insertion direction is received in the receiving space of the support frame 110. In this way, the top wall 116 may block a further movement in the second insertion direction of the conductor 210 that has been inserted into the conductive terminal 100 in the second insertion direction.

The second end wall 117 may block a further movement in the first insertion direction of the conductor 210 that has been inserted into the conductive terminal in the first insertion direction. In an embodiment, the second end wall 117 may be provided with a through hole, so that the conductor 210 of the wire 200 inserted in the first insertion direction may extend out of the through hole.

The first clamping portions 121, as shown in FIG. 2, have wire-penetrating portions 1211 and the second clamping portions 131 have wire-penetrating portions 1311. The wire-penetrating portions 1211, 1311 are adapted to clamp and penetrate an insulation layer of the wire 200 to be electrically connected with the conductor 210, and prevent the conductor 210 from being pulled from the first insertion hole 114 or the second insertion hole 115. With this arrangement, the conductor 210 of the wire 200 may be reliably held in the conductive terminal 100.

As shown in FIGS. 1-5, the first clamping arm 120 and/or the second clamping arm 130 further comprise a release portion. The release portion is adapted to move in a direction away from each other by an external force to spread the clamping portions 121 or 131, thereby releasing the wire 200. In an embodiment, the release portion of the first clamping arm 120 includes an arc portion formed on a side of at least one of the pair of the first clamping arms 120 away from the bottom wall 111. In the embodiment shown in FIGS. 2 and 3, a release portion 122 of the first clamping arm 120 includes two arc portions 1221 respectively formed on the sides of the pair of the first clamping arms 120. The arc portions 1221 are deflected outwardly away from each other. In another embodiment, the release portion of the second clamping arm 130 includes an arc portion formed on at least one of the two ends of the second clamping portion 131. In another embodiment, the release portion of the second clamping arm 130 includes two arc portions respectively formed on the two ends of the second clamping portion 131. The arc portions are deflected outwardly away from each other.

Figure 6:
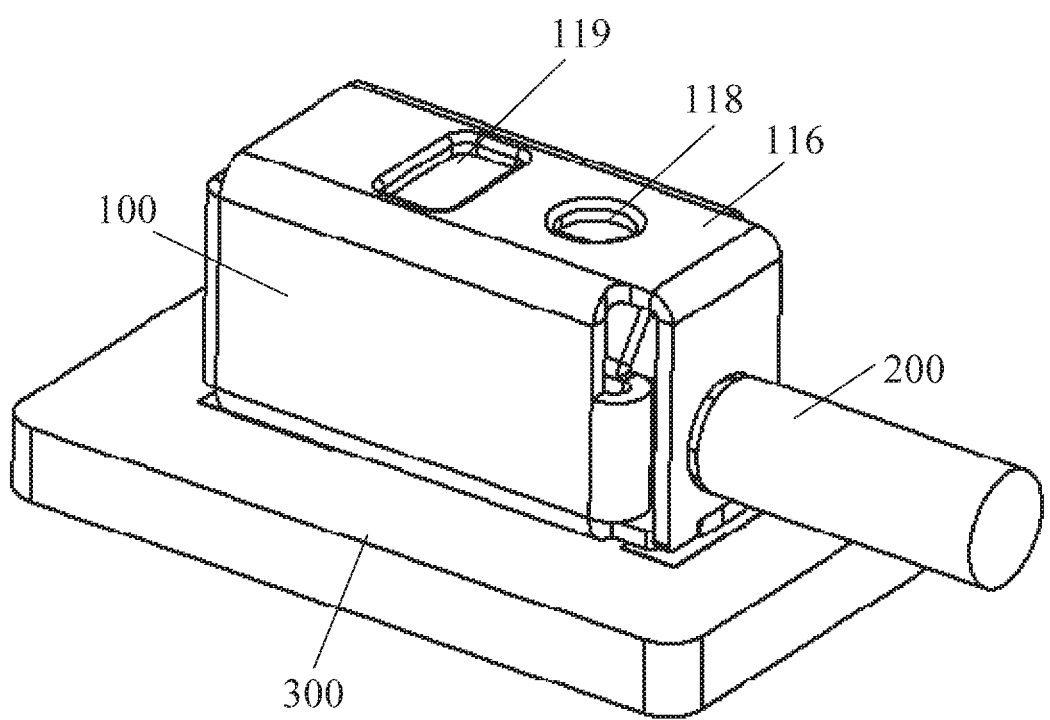
FIG. 6 is a perspective view of the connector assembly with a conductor of a wire inserted into the connector assembly in a first insertion direction.

As shown in FIGS. 1 and 6, the top wall 116 is provided with a release hole 119, and an external release tool is adapted to drive the release portion 122 through the release hole 119 and cause the release portion 122 to move in directions away from each other to release the wire 200. In the shown embodiment, the release hole 119 is aligned with the release portion 122 of the first clamp arm 120. In another embodiment, the release hole 119 may be not aligned with the release portion 121 of the first clamp arm 120. In another embodiment, the top wall 116 has a release hole that is aligned with the release portion of the second clamp arm 130.

Figure 7:
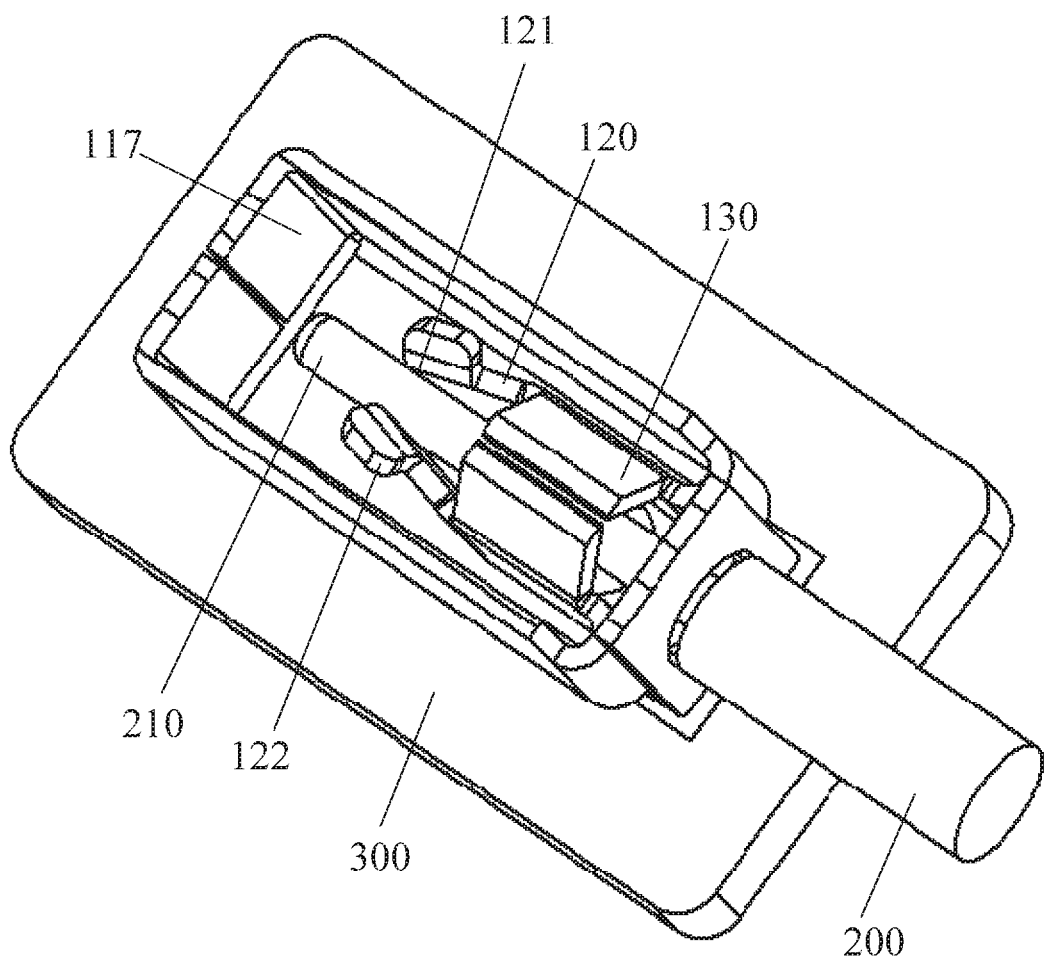
FIG. 7 is a sectional perspective view of the connector assembly of FIG. 6.
Figure 8:
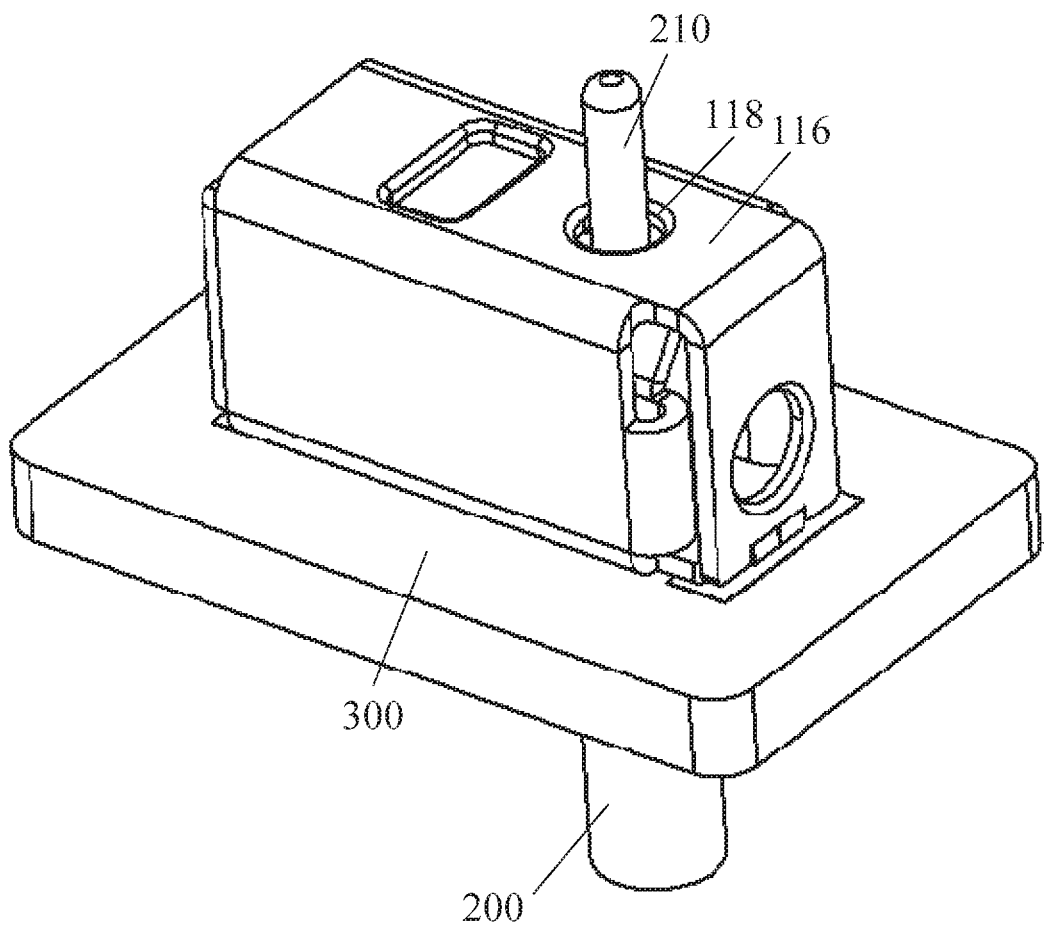
FIG. 8 is a perspective view of the connector assembly with the conductor of the wire inserted into the connector assembly in a second insertion direction.
Figure 9:
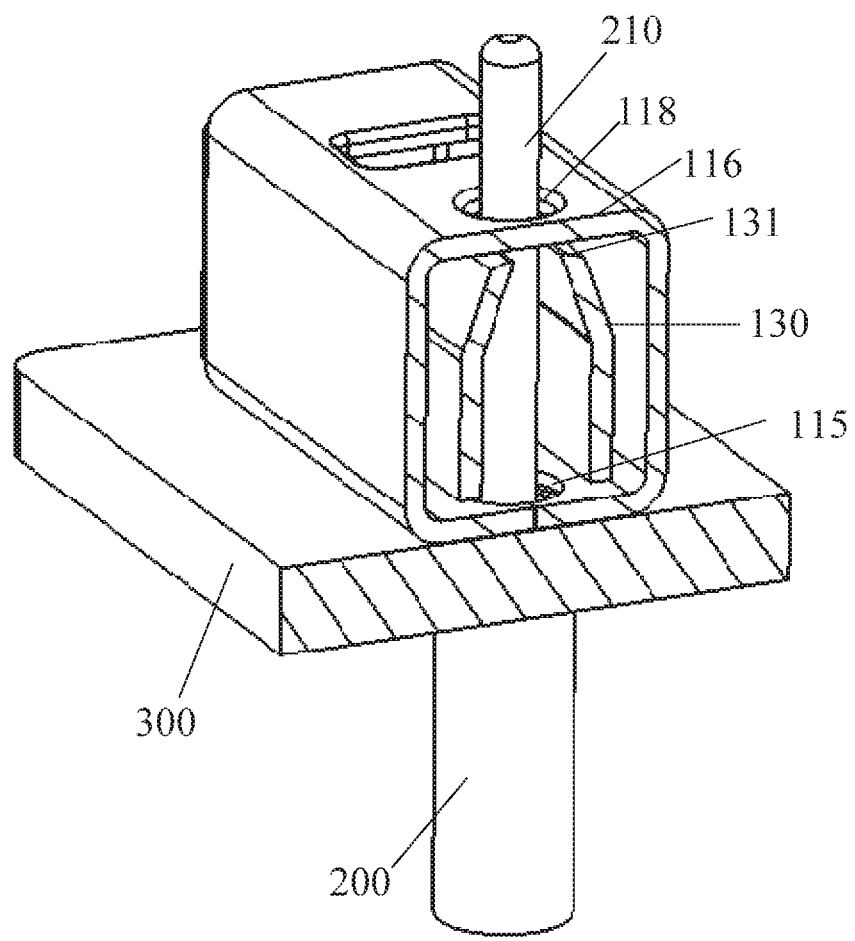
FIG. 9 is a sectional perspective view of the connector assembly of FIG. 8.

A connector assembly 1 according to an embodiment, as shown in FIGS. 1 and 6-9, includes the conductive terminal 100 and the circuit board 300, the conductive terminal 100 being electrically connected to the circuit board 300. The conductive terminal 100 is the one of any of the embodiments. The circuit board 300 has a through hole. The second clamping arm 130 of the conductive terminal 100 is adapted to clamp the conductor 210 of the wire 200 inserted through the through hole of the circuit board 300 from the second insertion direction, as shown in FIGS. 8 and 9.

In an embodiment, with suction nozzles of the vacuum adsorption apparatus sucking the top wall 116 of the support frame 110 of the conductive terminal 100, the bottom wall 111 of the support frame 110 is fitted with a surface of the circuit board 300, the second insertion hole 115 of the conductive terminal 100 is aligned with the through hole of the circuit board 300, and then the conductive terminal 100 is soldered to solder pads of the circuit board 300 by surface mount technology (SMT). Therefore, a reliable electrical connection between the conductive terminals 100 and the circuit board 300 is achieved.

As shown in FIGS. 6 and 7, during insertion of the wire 200 into the conductive terminal 100 in the first insertion direction, the conductor 210 of the wire 200 is inserted into the conductive terminal 100 from the insertion hole 114 and clamped by the pair of first clamping arms 120. The wire-penetrating portion 1211 of the first clamping portion 121 of the first clamping arm 120 penetrates an insulation layer of the wire 200, such that the wire 200 is reliably held and electrically connected with the conductive terminal 100. In an embodiment, during releasing the wire 200 from the conductive terminal 100, the external release tool passes through the release hole 119 to drive the release portion 122, so that the release portion 122 moves towards the directions away from each other, the clamp portion 121 clamping the wire 200 is spread, and thus the wire 200 is released. In an embodiment, an end of the external release tool is a plate member. In an embodiment, the external release tool is a screwdriver.

As shown in FIGS. 8 and 9, during insertion of the wire 200 into the conductive terminal 100 in the second insertion direction, the conductor 210 of the wire 200 passes through the through hole of the circuit board 300, and is inserted into the conductive terminal 100 from the second insertion hole 115 in the second insertion direction and clamped by the pair of second clamping arms 130. The wire-penetrating portion 1311 of the second clamping portion 131 of the second clamping arm 130 penetrates an insulation layer of the wire 200, such that the wire 200 is reliably held and electrically connected with the conductive terminal 100.

The conductive terminal 100 allows the wire 200 to be inserted selectively from the first or second insertion direction, so as to meet the requirement of inserting the wire 200 from two directions.

Although the present disclosure has been described with reference to the attached drawings, the embodiments disclosed in the drawings are intended to illustrate the embodiments of the present disclosure, but should not be construed as a limitation to the present disclosure.

Although several exemplary embodiments have been shown and described, it would be appreciated by those skilled in the art that various changes or modifications may be made in these embodiments without departing from the principles and spirit of the disclosure, the scope of which is not defined by the exemplary embodiments of the present disclosure, but defined in the claims and their equivalents.

What is claimed is:

1. A conductive terminal adapted to electrically connect a wire to a circuit board, comprising:
a support frame defining a receiving space;
a pair of first clamping arms arranged in the receiving space, a pair of first clamping portions are disposed at a pair of ends of the first clamping arms, the first clamping portions are adapted to clamp a conductor of the wire inserted in a first insertion direction and electrically connect the wire with the conductive terminal; and
a pair of second clamping arms arranged in the receiving space, a pair of second clamping portions are disposed at a pair of ends of the second clamping arms, the second clamping portions are adapted to clamp the conductor of the wire inserted in a second insertion direction different from the first insertion direction and electrically connect the wire with the conductive terminal.

2. The conductive terminal of claim 1, wherein the first insertion direction is perpendicular to the second insertion direction.

3. The conductive terminal of claim 2, wherein the support frame includes a bottom wall and a pair of side walls perpendicular to the bottom wall.

4. The conductive terminal of claim 3, wherein the first insertion direction is parallel to a plane of the bottom wall and the second insertion is perpendicular to the plane of the bottom wall.

5. The conductive terminal of claim 1, wherein the support frame, the first clamping arms, and the second clamping arms are integrally formed from a single piece of sheet metal.

6. The conductive terminal of claim 4, wherein the support frame has a pair of cantilevers bent inwardly from a pair of first ends of the side walls.

7. The conductive terminal of claim 6, wherein the pair of first clamping arms extend from the cantilevers in the first insertion direction and obliquely toward each other in a direction away from the first ends of the side walls.

8. The conductive terminal of claim 7, wherein the pair of second clamping arms extend from the cantilevers in the second insertion direction and obliquely toward each other in a direction away from the bottom wall.

9. The conductive terminal of claim 4, wherein the support frame has a first end wall having a first insertion hole, the conductor of the wire is inserted through the first insertion hole in the first insertion direction.

10. The conductive terminal of claim 4, wherein the bottom wall has a second insertion hole, the conductor of the wire is inserted through the second insertion hole in the second insertion direction.

11. The conductive terminal of claim 9, wherein the support frame has a top wall, the side walls are bent perpendicularly downward from a pair of sides of the top wall.

12. The conductive terminal of claim 11, wherein the bottom wall is bent perpendicularly from a lower side of at least one of the two side walls toward an opposite one of the side walls.

13. The conductive terminal of claim 12, wherein the first end wall is bent perpendicularly from an end of the top wall toward the bottom wall.

14. The conductive terminal of claim 9, wherein the support frame has a second end wall opposite to the first end wall and adapted to block the conductor of the wire inserted in the first insertion direction.

15. The conductive terminal of claim 13, wherein the top wall has a through hole, the conductor of the wire inserted in the second insertion direction extends out of the conductive terminal through the through hole.

16. The conductive terminal of claim 13, wherein the first clamping arms and/or the second clamping arms have a pair of release portions adapted to move away from each other under an external force and spread the first clamping portions and/or the second clamping portions.

17. The conductive terminal of claim 16, wherein the top wall has a release hole communicating with the release portions.

18. The conductive terminal of claim 1, wherein the first clamping portions and the second clamping portions each have a pair of wire penetrating portions clamping and penetrating an insulation layer of the wire.

19. A connector assembly, comprising:
a conductive terminal including a support frame defining a receiving space, a pair of first clamping arms arranged in the receiving space, and a pair of second clamping arms arranged in the receiving space, a pair of first clamping portions are disposed at a pair of ends of the first clamping arms, the first clamping portions are adapted to clamp a conductor of a wire inserted in a first insertion direction and electrically connect the wire with the conductive terminal, a pair of second clamping portions are disposed at a pair of ends of the second clamping arms, the second clamping portions are adapted to clamp the conductor of the wire inserted in a second insertion direction different from the first insertion direction and electrically connect the wire with the conductive terminal; and
a circuit board electrically connected to the conductive terminal, the circuit board having a through hole, the second clamping arms clamp the conductor of the wire inserted through the through hole of the circuit board in the second insertion direction.

* * * * *